United States Patent [19]

Takeshita

[11] Patent Number: 5,745,343
[45] Date of Patent: Apr. 28, 1998

[54] CUBICLE FOR INVERTER

[75] Inventor: Makoto Takeshita, Yamanashi, Japan

[73] Assignee: Fanuc, Ltd., Yamanashi, Japan

[21] Appl. No.: 911,438

[22] Filed: Aug. 12, 1997

Related U.S. Application Data

[63] Continuation of Ser. No. 550,368, Oct. 30, 1995, abandoned.

[30] Foreign Application Priority Data

Nov. 11, 1994 [JP] Japan .................................. 6-277480

[51] Int. Cl.$^6$ .................................................. H05K 7/20
[52] U.S. Cl. ........................ 361/689; 257/714; 361/699; 363/141
[58] Field of Search ..................... 363/141; 62/414, 62/418, 259.2; 165/80.4, 104.33; 257/712–714; 361/676, 677, 689, 699–701; 200/289

[56] References Cited

U.S. PATENT DOCUMENTS

| | | | |
|---|---|---|---|
| 3,586,917 | 6/1971 | Oates | 361/399 |
| 4,317,952 | 3/1982 | Armor | 361/699 |
| 4,513,346 | 4/1985 | Devins | 361/700 |
| 4,566,529 | 1/1986 | Klein | 165/32 |
| 4,720,981 | 1/1988 | Helt | 62/113 |
| 4,928,138 | 5/1990 | Walton | 361/676 |
| 5,052,472 | 10/1991 | Takahashi | 165/1 |
| 5,111,280 | 5/1992 | Iversen | 357/82 |

FOREIGN PATENT DOCUMENTS

| | | | |
|---|---|---|---|
| 0145212 | 6/1985 | European Pat. Off. | 361/699 |
| 2624684 | 6/1989 | France | 361/699 |

*Primary Examiner*—Gerald P. Tolin
*Attorney, Agent, or Firm*—Staas & Halsey

[57] ABSTRACT

A cubicle which houses an inverter provided a tube which is placed to creep in a zigzag along the surface of at least one wall of the cubicle, preferably the wall on which a switching element is attached, and in which a cooling liquid is flown.

2 Claims, 1 Drawing Sheet

CUBICLE FOR INVERTER

This application is a continuation of application No. 08/550,368, filed Oct. 30, 1995, now abandoned.

FIELD OF THE INVENTION

This invention relates to an improvement applicable to a cubicle which houses an inverter employable for a numerical control system, a robot system, or the like, therein. More specifically, this invention relates to an improvement developed for improving the cooling efficiency and for reducing the external dimension.

BACKGROUND OF THE INVENTION

FIG. 1 illustrates the cross-sectional view of a cubicle which houses an inverter available in the prior art. Referring to the drawing, a switching element 6 employed as a motor driver of an inverter, is fitted on the internal surface of the back board of a cubicle 1. A heat exchanging chamber 8 is fitted to cover the back board of the cubicle 1. A heat sink 7 of the switching element 6 sticks out into the heat exchanging chamber 8 which is cooled by air flown as shown by an arrow B.

The heat generated in the switching element 6 and conducted to the heat sink 7 warms the air in the heat exchanging chamber 8 which is equipped with cooling fans 9 and 10. Since the air in the heat exchanger 8 is cooled by the air flown as shown by the arrow B, the heat sink 7 is cooled by the air.

In this manner, two steps are necessary for cooling the cubicle which houses an inverter available in the prior art. Therefore, the cooling efficiency is unsatisfactory for the cubicle which houses an inverter available in the prior art. Further, since the external diameter of the heat sink of a switching element employable as a motor driver of an inverter is large in size, and since the size of the heat exchanging chamber is also large, the cubicle which houses an inverter available in the prior art is involved with a drawback in which the external diameter is large.

SUMMARY OF THE INVENTION

Accordingly, the object of this invention is to provide a cubicle which houses an inverter, the cubicle having high cooling efficiency and having a small external dimension.

To achieve the foregoing object, a cubicle which houses an inverter in accordance with this invention is provided a tube which is placed to creep in a zigzag along the surface of at least one wall of the cubicle and in which a cooling liquid is flown.

The surface of the wall of the cubicle on which the tube in which the cooling liquid flows is placed, is preferably the wall on which a switching element is attached.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE INVENTION

Referring to a drawing, a detailed description will be presented below for a cubicle which houses an inverter in accordance with this invention.

Figure 1:
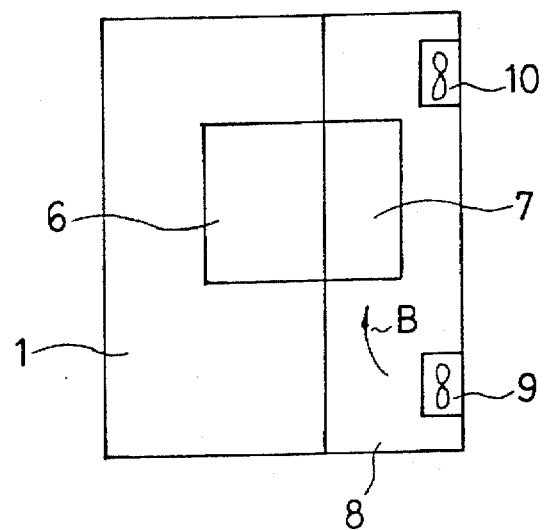
FIG. 1 is a cross-sectional view of a cubicle which houses an inverter available in the prior art.
Figure 2:
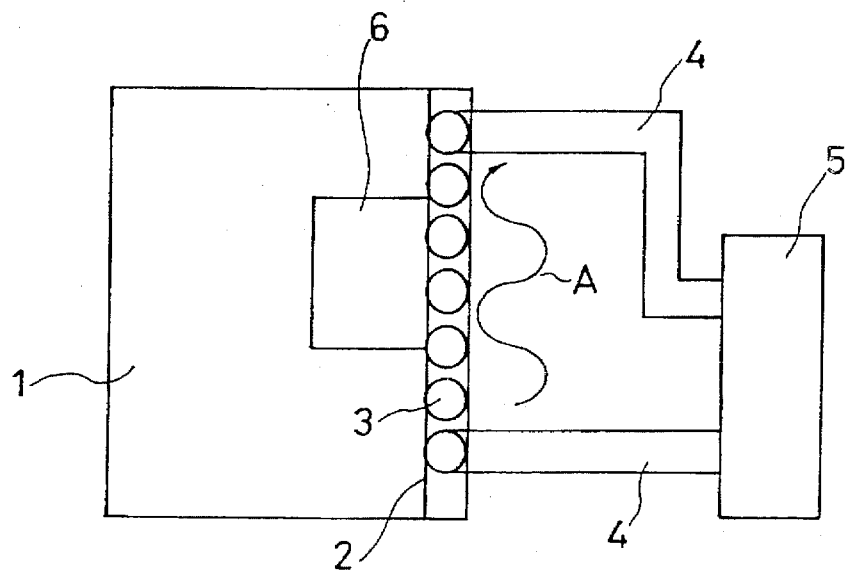
FIG. 2 is a cross-sectional view of a cubicle which houses an inverter in accordance with this invention.

Referring to FIG. 2, a tube 3 is placed to creep in a zigzag along the back surface of the back wall 2 of a cubicle 1. A cooling liquid is flown in the tube 3 through cooling liquid supply pipes 4 which are connected to a cooling liquid cooler 5. The cooling liquid flows in the tube 3 in a zigzag as shown in an arrow A. As clearly shown in FIG. 2, there is a continuous piping (tube 3) extending in a manner that the continuous piping is folded back from side to side at every end of the heat exchange wall, resultantly making a plural layer extending in a width direction of the heat exchange wall (back wall 2), with the flow direction of a coolant alternating every layer (Arrow A). A switching element 6 which is employed as a motor driver of an inverter is fitted on the front surface of the back wall 2 of the cubicle 1.

The heat generated in the switching element 6 is conducted to the tube 3 through the back wall 2 of the cubicle 1, and the tube 3 is directly cooled by the cooling liquid.

Therefore, the cooling efficiency of the cubicle which houses an inverter is improved. Further, since the switching element 6 does not need a heat sink which is usually large in size, and since the cubicle 1 does not need a heat exchanging chamber, the external diameter of the cubicle which houses an inverter is reduced.

The above description has clarified that a cubicle which houses an inverter, which cubicle has high cooling efficiency and a small size, has been successfully provided.

What is claimed is:

1. A cubicle for an inverter, comprising:

a housing having a heat exchange wall and an internal chamber substantially completely surrounded by the housing, the heat exchange wall having a length and a width;

a switching element for an inverter which generates heat, mounted on the heat exchange wall of the housing to extend on the heat exchange wall along the length and width of the heat exchange wall such that the switching element is substantially completely surrounded by the housing; and a cooling system comprising:

a continuous piping having a plurality of layers extending in a width direction of the heat exchange wall, along the heat exchange wall in a shape such that the continuous piping is folded back at the ends of the heat exchange wall, with a flow direction of a coolant in the piping alternating every layer; and coolant flowing in the piping so that heat is diffused through the wall to simultaneously cool the housing and the inverter, whereby improving the heat diffusion of said cubicle for an inverter and eliminating the need for a heat sink for said cubicle for an inverter, resultantly reducing the external dimension of said cubicle for an inverter.

2. A cubicle for an inverter according to claim 1, wherein the piping has a zig-zag shape long the heat exchange wall such that the piping extends from one end to an opposing end of the heat exchange wall while going from side to side.

* * * * *